(12) United States Patent
Kasahara et al.

(10) Patent No.: US 6,479,840 B2
(45) Date of Patent: Nov. 12, 2002

(54) DIODE

(75) Inventors: Takeshi Kasahara, Saitama-Ken (JP); Shinichi Shigematsu, Saitama-Ken (JP)

(73) Assignee: Toko, Inc., Tokyo (JP)

( * ) Notice: Subject to any disclaimer, the term of this patent is extended or adjusted under 35 U.S.C. 154(b) by 0 days.

(21) Appl. No.: 09/800,540

(22) Filed: Mar. 7, 2001

(65) Prior Publication Data

US 2001/0020704 A1 Sep. 13, 2001

(30) Foreign Application Priority Data

Mar. 7, 2000 (JP) ......................... 2000-061503

(51) Int. Cl.[7] .............................. H01L 29/88
(52) U.S. Cl. .................. 257/106; 257/46; 257/104; 257/109; 257/480; 257/595
(58) Field of Search .............. 257/46, 106, 104, 257/109, 480, 481, 595, 601, 603, 656

(56) References Cited

U.S. PATENT DOCUMENTS

| 5,066,991 | A | * | 11/1991 | Jackson | ............... | 357/13 |
| 5,181,083 | A | * | 1/1993 | Pezzani | ............... | 257/491 |
| 5,220,193 | A | * | 6/1993 | Kasahara et al. | ............... | 257/595 |
| 6,303,979 | B1 | * | 10/2001 | Kasahara | ............... | 257/656 |

FOREIGN PATENT DOCUMENTS

JP              03041779 A    *   2/1991

* cited by examiner

Primary Examiner—Nathan J. Flynn
Assistant Examiner—Remmon R. Forde
(74) Attorney, Agent, or Firm—Cohen, Pontani, Lieberman & Pavane

(57) ABSTRACT

Disclosed is an inventive diode which can reduce a stray capacity to improve various characteristics thereof, in which a dielectric layer, a conductive layer and a second dielectric layer are respectively formed by deposition in this order on an upper face of a semiconductor substrate excluding a central portion of an exposed surface of a P-type region. Then, an anode side electrode is formed extending from the exposed surface of the P-type region to the upper face of the second dielectric layer, and is electrically connected with the P-type region. Herein, the conductive layer is formed such that it is isolated from the electrode by the second dielectric layer, is connected with the semiconductor substrate upper face in a location where the dielectric layer has not been formed, and partially resides in a location sandwiched between the electrode and the semiconductor substrate. Such configuration could prevent a depletion layer from being generated in the vicinity of a surface of a higher resistivity region lying under the conductive region. Further, according to such configuration, a stray capacity between the electrode and the semiconductor substrate could be made lower than the capacity value generated between the electrode and the conductive layer.

18 Claims, 3 Drawing Sheets

DIODE

FIELD OF THE INVENTION

The present invention relates to a technology for reducing a stray capacity of a diode, thus to improve the characteristic thereof.

DESCRIPTION OF THE PRIOR ART

A diode of P-i-N configuration can be produced by forming an i-type semiconductor region with extremely low impurity concentration having high resistivity between a P-type semiconductor region with high impurity concentration having low resistivity and a N-type semiconductor region with high impurity concentration having low resistivity. The diode of this PiN configuration is characterized in that a value of the resistivity between an anode and a cathode varies in response to a magnitude of current passing therethrough when it is biased in the forward direction. In addition, the diode of this PiN configuration is characterized in that, when biased in the backward direction, a depletion layer widens into the i-type semiconductor region, resulting in a capacity in the junction area to be significantly varied or a withstand voltage in the backward direction to be greater. Owing to these features, the diode of PiN configuration has been applied to a high withstand voltage rectification element, a variable resistance element or a variable capacity element.

FIG. 1 is a cross sectional view of an exemplary conventional PiN diode illustrating a main part thereof.

In this conventional PiN diode, a layer of N-type region 2 and a layer of higher resistivity region 3 are formed by deposition within a semiconductor substrate, and further a P-type region 4 is formed within the higher resistivity region 3. It should be noted that the N-type region 2 is formed so that the surface thereof is exposed in a lower face side of the semiconductor substrate. The P-type region 4 is formed so that the surface thereof is exposed in an upper face side of the semiconductor substrate while occupying a part of a region on the upper face of the semiconductor substrate. That is, the P-type region 4 is formed in the vertical direction from the upper face of the semiconductor substrate down to a predetermined depth so that the higher resistivity region 3 may be interposed between the P-type region 4 and the N-type region 2, thus to fabricate the semiconductor substrate of P-i-N configuration. Herein, the P-type region 4 serves as an anode and the N-type region 2 serves as a cathode of the diode.

An electrode 1 is arranged on the top of the N-type region 2, which is exposed in the lower face side of the semiconductor substrate. A dielectric layer 5 is formed over the upper face of the semiconductor substrate excluding a central portion of the exposed surface of the P-type region 4. An electrode 6 is arranged to cover the exposed surface of the P-type region 4 and a part of an upper face of the dielectric layer 5. It should be noted that the electrode 6 is electrically connected to the P-type region 4 in the exposed surface of the P-type region 4. A wire 7 is bonded to the upper face of the electrode 6.

Herein, the higher resistivity region 3 is treated as an intrinsic semiconductor (i) region, and for this reason, the diode with the configuration as illustrated in FIG. 1 is called a PiN diode. However, due to the various circumstances, it has been frequently observed that this higher resistivity region 3 has turned to be a N-type semiconductor doped with extremely little amount of N-type impurities and having fewer carriers.

In the diode having the PiN configuration as shown in FIG. 1, assume the case where a positive voltage is applied to the electrode 6 and a negative voltage to the electrode 1. That is to say, assume that a forward voltage is applied between the anode and cathode of the diode.

Since the impurity concentration in the higher resistivity region 3 is extremely low, inherently the resistivity value of the higher resistivity region 3 is high in accordance with the intrinsic semiconductor. However, when the forward voltage is applied to the diode, electrons, majority carriers in the N-type semiconductor, are injected into the higher resistivity region 3 from the N-type region 2. Accordingly, the concentration of carriers within the higher resistivity region 3 increases and the resistivity value of the higher resistivity region 3 decreases. In the view that a current is a stream of electrons, the more forward current passes between the anode and cathode of the diode, the more electrons are injected into the higher resistivity region 3 from the N-type region 2. As a result, the resistivity value of the higher resistivity region 3 changes in response to the magnitude of the forward current, and this PiN diode exhibits a negative relation between current and resistance as shown in FIG. 2.

In contrast with this, assume the case where a negative voltage is applied to the electrode 6 and a positive voltage to the electrode 1 in FIG. 1. That is to say, assume that a backward voltage is applied between the anode and the cathode of the diode.

When the negative voltage is applied to the electrode 6, a depletion layer is created in a part of the P-type region 4 and inside the higher resistivity region 3. At that time, a junction capacity is generated between the P-type region 4 and the higher resistivity region 3 each being disposed in an opposite side from other with respect to the depletion layer, respectively. It should be noted that, if the depletion layer widens over an entire area of the higher resistivity region 3, the junction capacity is generated between the P-type region 4 and the N-type region 2 each being disposed in an opposite side from other with respect to the higher resistivity region 3 respectively. Herein, since the higher resistivity region 3 has a lower concentration of impurities, the number of carriers (electrons, or holes) per unit volume in the higher resistivity region 3 is much less in comparison with that in the N-type region 2. Owing to this, the depletion layer within the higher resistivity region 3 changes its formation region significantly in response to a slight change in the backward voltage. The junction capacity of the diode is subject to change according to a state of the depletion layer, in particular a thickness of the depletion layer. Because of this, the diode of PiN configuration is characterized in that the junction capacity thereof varies in response to the change of voltage.

In recent years, a frequency of a signal processed in an electronic device has been much higher than the frequency used in the past. If the higher frequency of the signal is used, a smaller value of an electrostatic capacity of a capacitive element is required, as could be seen from, for example, a relational expression defined as $1/f=2\pi(LC)^{1/2}$. When the diode is used as a variable capacitive element, an area of the PN junction must be reduced in order to make the capacity value thereof smaller. In practice, in order to reduce the capacity value of the diode with the configuration as shown in FIG. 1, the P-type region 4 must be formed to be as small as possible.

By the way, a diameter of a contact portion 7a, which will be created in the tip of a wire 7 for wiring when the wire 7 is bonded to the electrode 6, could expand to be about three times as big as the diameter of the wire 7. Because of this, the electrode 6 must have been formed much larger than the possible diameter of the contact portion 7a. Accordingly, a projected area of the electrode 6 onto the upper face of the semiconductor substrate should be larger than the area of the P-type region 4 and thereby the electrode 6 has to be partially expanded outwardly along a plane direction of the substrate beyond the P-type region 4. As a result, a capacity other than the junction capacity, what is called a stray capacity, would be generated between the electrode 6 and the higher resistivity region 3 each being disposed in opposite side from other placing the dielectric layer 5 therebetween. A total value of this stray capacity and the junction capacity would make a substantial capacity value of the variable capacity element. Therefore, there has been a problem that a minimum capacity value possible to be set for the variable capacity element becomes greater by the stray capacity being added to the junction capacity.

Further, when the backward voltage is applied between the anode and the cathode, disadvantageously the depletion layer would be formed also in the vicinity of the surface of the higher resistivity region 3 lying under the electrode 6 by an electrostatic inductive action of the negative voltage applied to the electrode 6, as shown in FIG. 3. Thus, there has been a problem that a ratio of a maximum value to a minimum value for an available capacity of the variable capacity element is limited to be smaller by the undesired depletion layer formed in the vicinity of the surface of the higher resistivity region 3 and by said stray capacity added to the capacity value of the diode. By the way, this ratio of the maximum value to the minimum value for the available capacity is generally referred to as a rate of change.

On the other hand, when the diode of PiN configuration is used as a variable resistance element, preferably a current-resistance characteristic between the anode and the cathode should change linearly. Further, a resistance value occurring between the anode and the cathode when the forward current being small is preferably as high as possible. However, the actual resistance value, which occurs between the anode and the cathode, is lower than an ideal characteristic (a straight line) in a range of smaller forward current, as shown in FIG. 2. Thus, this has caused another problem that, as larger stray capacity occurs between the anode and the cathode, the resistance value between the anode and the cathode in the range of smaller forward current becomes lower comparing with the value for the ideal characteristic.

SUMMARY OF THE INVENTION

In the light of the problems described above, an object of the present invention is to provide a diode which can reduce a stray capacity to improve various characteristics thereof.

The object described above could have been accomplished by an inventive diode having an anode region made up of P-type semiconductor and a cathode region made up of N-type semiconductor each formed within a semiconductor substrate, said diode comprising: said anode region formed such that a surface thereof is exposed on a predetermined face of the semiconductor substrate while occupying a part of a region on a predetermined face; an electrode arranged on the surface of said anode region so as to be connected therewith; and a conductive layer which is partially interposed between the electrode and the semiconductor substrate, is isolated from the electrode by a dielectric layer, and is connected with the semiconductor substrate in a predetermined location.

In practice, a diode according to the present invention employs a configuration as described below.

A P-type region, a N-type region and a higher resistivity region are formed within a semiconductor substrate, thus to make a P-i-N configuration. Herein, P-type region is formed so that the surface thereof is exposed in the upper face side of the semiconductor substrate so as to occupy a part of the region on the upper face of the semiconductor substrate. Further, the P-type region is formed in the vertical direction from the upper face of the semiconductor substrate to a level of predetermined depth. The N-type region is formed so that the surface thereof is exposed in the lower face side of the semiconductor substrate. The higher resistivity region is formed so as to be interposed between the P-type region and the N-type region. A dielectric layer, a conductive layer and a second dielectric layer are formed by deposition in this order on the upper face of the semiconductor substrate excluding a central portion of the exposed surface of the P-type region. Then, an electrode is formed so as to be connected with the P-type region, also covering a range from the exposed surface of the P-type region to the upper face of the second dielectric layer.

Herein, the conductive layer is formed so that it is isolated from the electrode by the second dielectric layer, is connected with the semiconductor substrate upper face in a location where the dielectric layer has not been formed, and resides at least partially in a location sandwiched between the electrode and the semiconductor substrate. Preferably, the conductive layer is formed so as to be necessarily interposed between the electrode and the semiconductor substrate, and the conductive layer is connected with the semiconductor substrate upper face in a location more distant from the outer edge portion of the electrode with respect to the P-type region. More preferably, when the semiconductor substrate is fabricated, a lower resistivity region made up of N-type semiconductor should be formed in the junction area of the semiconductor substrate, where the semiconductor substrate is to be connected with the conductive layer, so that the surface of the N-type semiconductor is exposed on the upper face of the semiconductor substrate.

DESCRIPTION OF THE PREFERRED EMBODIMENTS

Figure 1:
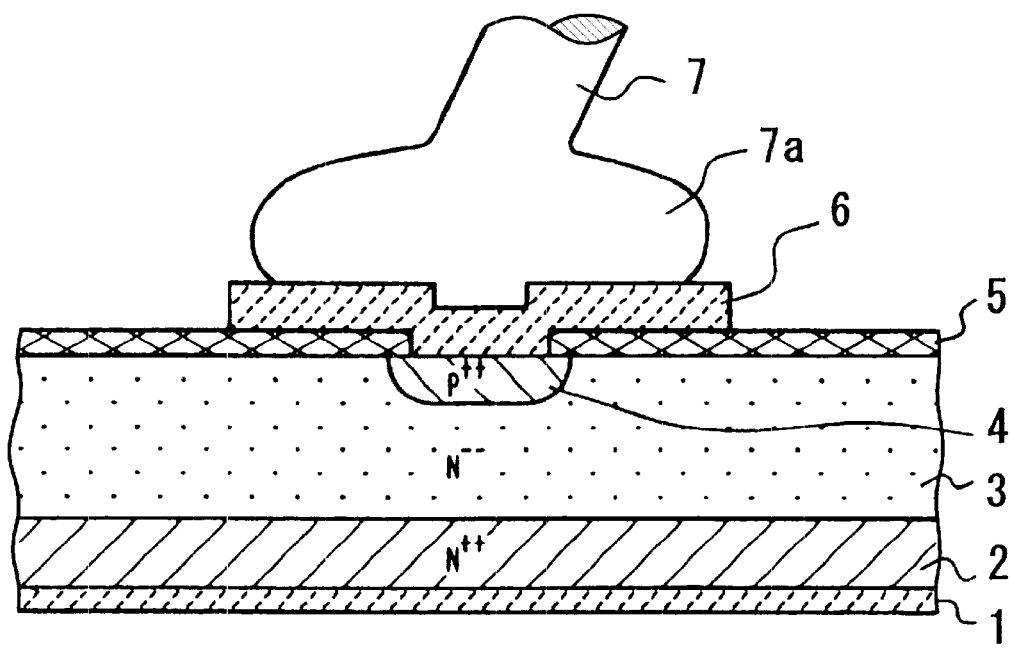
FIG. 1 is a sectional view of main portion of a diode with a typical PiN configuration of the prior art.
Figure 2:
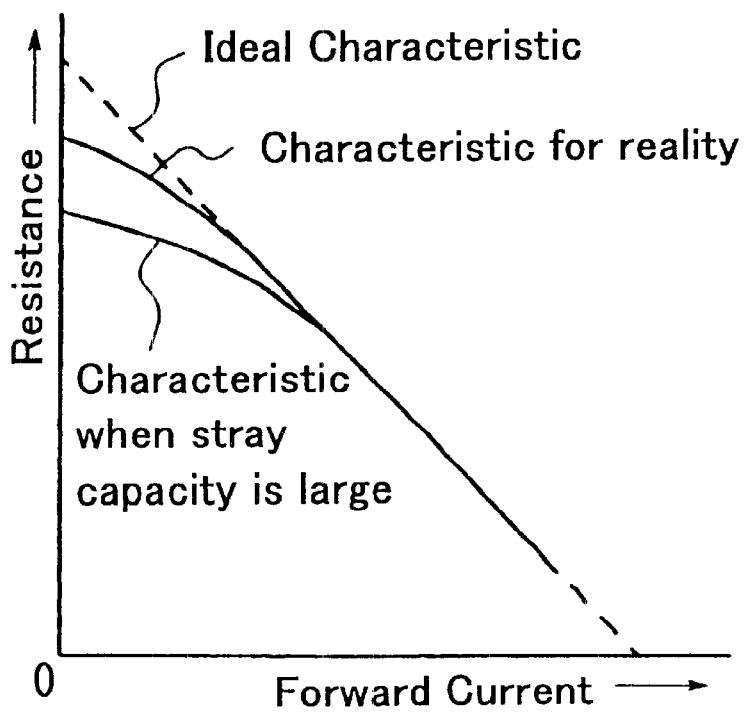
FIG. 2 is a diagram illustrating a current-resistance characteristic of a diode with the PiN configuration.
Figure 3:
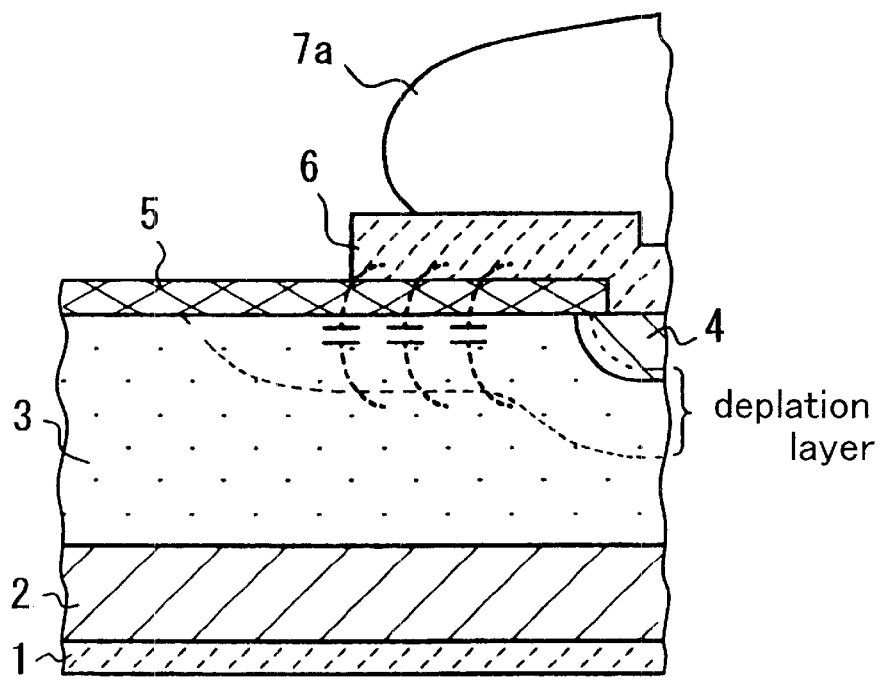
FIG. 3 is a partial enlarged sectional view of FIG. 1.
Figure 4:
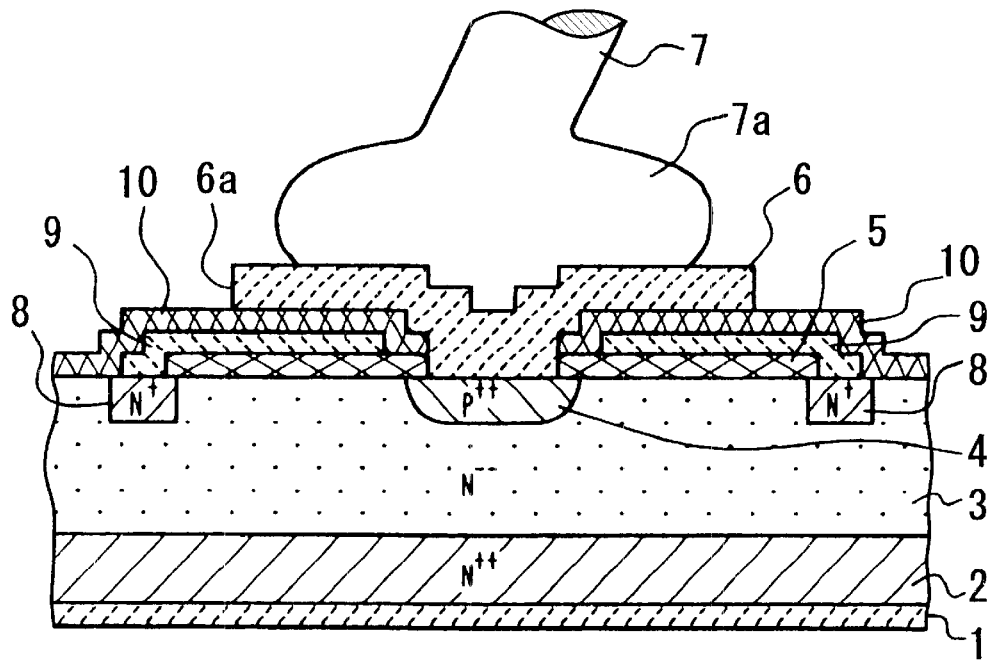
FIG. 4 is a sectional view illustrating a configuration of main portion of a diode according to a first embodiment of the present invention.

FIG. 4 shows a configuration of a diode capable of reducing a stray capacity according to a first embodiment of the present invention. It should be noted that FIG. 4 only illustrates a sectional view of the configuration of the main portion, omitting the illustration of other attaching components such as a package, a terminal and the likes.

The diode shown in FIG. 4 has a configuration as described below.

A N-type region 2 and a higher resistivity region 3 are formed by deposition within a semiconductor substrate, and further a P-type region 4 is formed in the higher resistivity region 3. It should be noted that in the above configuration, a surface of the N-type region 2 is exposed in a lower face side of the semiconductor substrate. The P-type region 4 is formed so that a surface thereof is exposed in an upper face side of the semiconductor substrate while occupying a part of a region on the upper face of the semiconductor substrate. Further, the P-type region 4 is formed vertically from the upper face of the semiconductor substrate to a level of predetermined depth so that the higher resistivity region 3 is interposed between the P-type region 4 and the N-type region 2. Herein, the P-type region 4 serves as an anode and the N-type region 2 serves as a cathode of the diode.

A cathode side electrode 1 is arranged on the top of the N-type region exposed in the lower face side of the semiconductor substrate. In the upper face side of the semiconductor substrate, a dielectric layer 5 is formed in a predetermined annular region centering around the P-type region 4 excluding the central portion of the exposed surface of the P-type region 4. On the top of this dielectric layer 5, a conductive layer 9 is formed by deposition. At a location on the substrate distant from the P-type region 4 along a plane direction where the dielectric layer 5 has not been formed, the conductive layer 9 is connected with a surface of a lower resistivity region 8 made up of N-type semiconductor formed within the semiconductor substrate. It should be noted that during a process for fabricating the semiconductor substrate, also the lower resistivity region 8 has been formed within the higher resistivity region 3 occupying a portion which is to include and to be proximal to the outer edge portion of the dielectric layer 5, with the top thereof exposed in the upper face side of the semiconductor substrate. A second dielectric layer 10 is formed to cover the dielectric layer 5, the conductive layer 9, the lower resistivity region 8 and the higher resistivity region 3, all of them lying in the upper face side, leaving the exposed surface of the P-type region 4 uncovered.

In a region defined as including the exposed surface of the P-type region 4 and a part of the upper face of the second dielectric layer 10, an electrode 6 is formed so as to be connected with the exposed surface of the P-type region 4. A wire 7 is bonded to the upper face side of the electrode 6.

A relative position relationship of each of the components is now additionally described.

The conductive layer 9, which is isolated from the electrode 6 by the second dielectric layer 10, has almost entire portion thereof sandwiched between the electrode 6 and the higher resistivity region 3 (the semiconductor substrate). The conductive layer 9 is formed so as to be extended to a location more distant from the outer edge portion 6a of the electrode 6 with respect to the P-type region 4, and preferably the conductive layer 9 should be formed so as to be interposed necessarily between the electrode 6 and the higher resistivity region 3. The lower resistivity region 8 is formed in a location distant from the P-type region 4, and is formed in the position more distant from the outer edge portion 6a of the electrode 6 with respect to the P-type region 4.

The respective components of the diode with the configuration described above operate as described below.

By the conductive layer 9 being connected with the lower resistivity region 8, the conductive layer 9 is electrically connected with the higher resistivity region 3 through the lower resistivity region 8. For this, a potential of the conductive layer 9 is led to the same potential as the higher resistivity region 3. This means that there occurs no potential difference between the conductive layer 9 and the higher resistivity region 3, each being located in opposite side of the dielectric layer 5 from other respectively, and thereby no stray capacity is generated in this portion. Further, the conductive layer 9 serves as an electrostatic shield against an electrostatic inductive action caused by a negative voltage applied to the electrode 6. This could prevent a depletion layer from being generated in the vicinity of the surface of the higher resistivity region 3 by the electrostatic inductive action.

In the diode with the configuration described above, it is anyhow not avoidable that a little amount of stray capacity is generated between the electrode 6 and the conductive layer 9, each being disposed in opposite side from other placing the second dielectric layer 10 therebetween. However, in the diode configured as described above, the stray capacity generated between the electrode 6 and the semiconductor substrate can be made lower than a value of the capacity generated between the electrode 6 and the conductive layer 9. Thus, the minimum capacity value possibly generated between the anode and the cathode of the diode could be made lower.

Therefore, when the diode employing the configuration according to the present invention is used as a variable capacity element, in comparison to the diode employing the configuration according to the prior art, the rate of change of the capacity could be made greater as well as the minimum allowable capacity value could be set smaller. Further, when this diode is used as a variable resistance element, the resistance value between the anode and the cathode in the range of smaller forward current could be higher, thus to make it approach to the ideal value.

Figure 5:
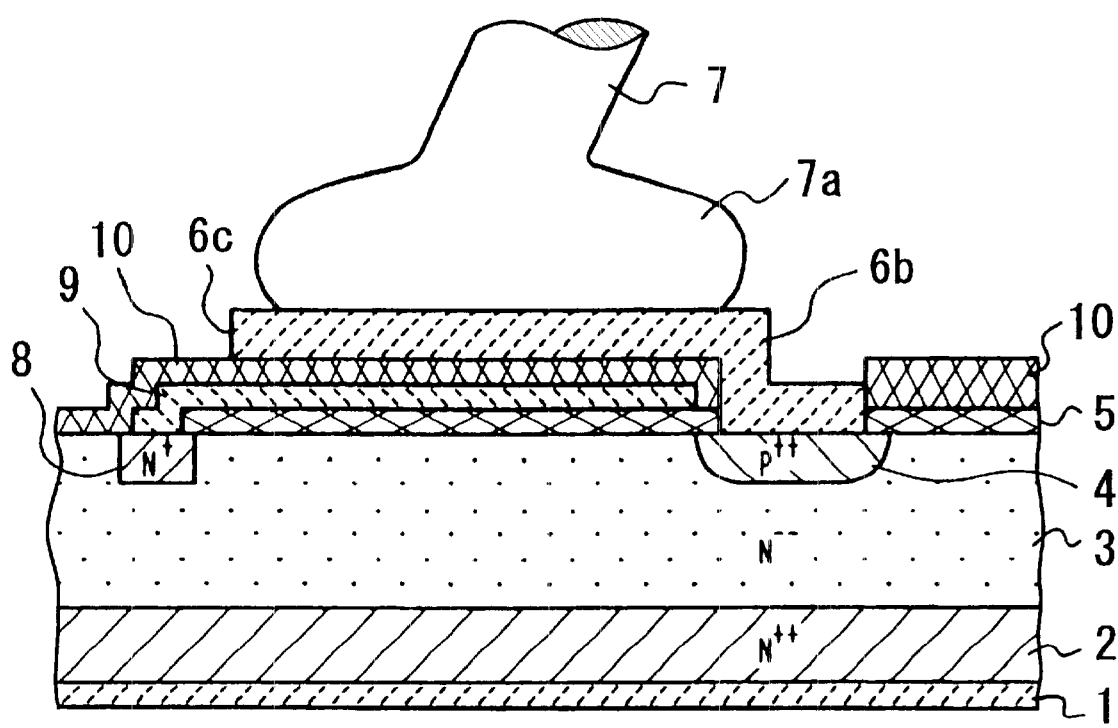
FIG. 5 is a sectional view illustrating a configuration of main portion of a diode according to a second embodiment of the present invention.

FIG. 5 shows a configuration of the diode according to a second embodiment of the present invention.

The electrode 6 of the diode shown in FIG. 4 has been formed to extend in the plane direction so as to cover almost entire area of the P-type region 4 centering therearound. An electrode 6b of the diode shown in FIG. 5, in contrast, is formed so as to extend to only the predetermined direction from the P-type region 4.

Also in the diode having the configuration of FIG. 5, the relative position relationship of respective components should be satisfied as described below.

A conductive layer 9, which is isolated from the electrode 6b by a second dielectric layer 10, has almost entire portion thereof sandwiched between the electrode 6b and a higher resistance region 3 (a semiconductor substrate). The conductive layer 9 is formed to extend to a location more distant from an outer edge portion 6c of the electrode 6b with respect to a P-type region 4. A lower resistivity region 8 is formed in a location distant from the P-type region 4, and is formed in the position more distant from the outer edge portion 6c of the electrode 6b with respect to the P-type region 4.

The configuration of FIG. 5 is basically same as that of FIG. 4, with the exception that the shapes of the electrode 6b, the conductive layer 9 and the dielectric layer 5 are different. The conductive layer 9, as shown in FIG. 5, also serves as an electrostatic shield, so that it could prevent a depletion layer from being generated in the vicinity of the surface of the higher resistivity region 3 by the electrostatic inductive action of a negative voltage applied to the electrode 6b. Thereby, when this diode is used as a variable capacity element, in comparison to the diode employing the configuration according to the prior art, the rate of change of the capacity could be made greater as well as the minimum capacity value could be made smaller. Further, when this diode is used as a variable resistance element, the resistance value between the anode and the cathode in the range of smaller forward current could be made higher.

In the respective embodiments shown in FIGS. 4 and 5, the lower resistivity region 8 has been formed in the higher resistivity region 3 within the semiconductor substrate, with the surface thereof being exposed in the upper face side of the semiconductor substrate, and the conductive layer 9 is connected with this surface of the lower resistivity region 8.

A simple junction of a semiconductor with a metal could sometimes causes the Shottky barrier to be formed in the junction plane. For example, if the Shottky barrier is formed in the junction plane between the conductive layer 9 and the semiconductor substrate, the carriers are blocked from moving between the conductive layer 9 and the higher resistivity region 3, resulting in the potential difference being generated between the conductive layer 9 and the higher resistivity region 3. Thus, to solve this problem, the lower resistivity region 8 has been formed in the embodiments shown in FIGS. 4 and 5. This lower resistivity region 8 prevents the formation of Shottky barrier, or causes the tunnel effect so that the movement of the carriers would not be blocked.

However, if the conductive layer 9 and the higher resistivity region 3 are respectively made of materials which prevent the formation of Shottky barrier even in the direct junction of the conductive layer 9 with the higher resistivity region 3, no lower resistivity region 8 may be arranged.

Further, even in the case where the area of the P-type region 4 is greater than that of the wire contact portion 7a, the configuration according to the present invention is applicable so long as the electrode 6 is formed to extend outwardly in the plane direction of the semiconductor substrate beyond the P-type region 4, and is able to obtain the effects therefrom.

It should be appreciated that the present invention is not limited to the configurations of the diodes as described with respect to the above embodiments, but the configuration may be modified without departing from the scope and spirit of the present invention. For example, the diode may have a configuration in which the conductive types (P-type or N-type) are inverted.

It is a matter of course that the present invention is applicable not only to a diode that is used as a variable capacity element or a variable resistance element, but also to any diode that requires the stray capacity thereof to be smaller.

What is claimed is:

1. A diode having an anode region made up of P-type semiconductor and a cathode region made up of N-type semiconductor each formed in a semiconductor substrate, said diode comprising:

said anode region formed so that the surface thereof is exposed in a predetermined face of said semiconductor substrate while occupying a part of a region on said predetermined face;

an electrode arranged on the surface of said anode region so as to be connected therewith; and a conductive layer which is partially interposed between said electrode and said semiconductor substrate, is isolated from said electrode by a dielectric layer, and is connected with said semiconductor substrate in a predetermined location.

2. A diode in accordance with claim 1, in which a surface of a semiconductor region of opposite conductive type to said anode region is exposed in a perimeter of said anode region in said predetermined face, and said conductive layer is arranged so as to be interposed between said surface of said semiconductor region and said electrode.

3. A diode in accordance with claim 1, in which a lower resistivity region is formed in said semiconductor substrate so that a surface of said lower resistivity region is exposed on said predetermined location where said semiconductor substrate is to be connected with said conductive layer.

4. A diode in accordance with claim 2, in which a lower resistivity region is formed in said semiconductor substrate so that a surface of said lower resistivity region is exposed on said predetermined location where said semiconductor substrate is to be connected with said conductive layer.

5. A diode in accordance with claim 1, in which a higher resistivity region is formed so as to be interposed between said anode region and said cathode region within said semiconductor substrate.

6. A diode in accordance with claim 5, in which a surface of said higher resistivity region is exposed in a perimeter of said anode region on said predetermined face, and said conductive layer is arranged so as to be interposed between said surface of said higher resistivity region and said electrode.

7. A diode in accordance with claim 5, in which a lower resistivity region is formed in said semiconductor substrate so that a surface of said lower resistivity region is exposed on said predetermined location where said semiconductor substrate is to be connected with said conductive layer.

8. A diode in accordance with claim 6, in which a lower resistivity region is formed in said semiconductor substrate so that a surface of said lower resistivity region is exposed on said predetermined location where said semiconductor substrate is to be connected with said conductive layer.

9. A diode in accordance with claim 8, in which said higher resistivity region is doped with impurities for producing N-type of conductive type with a concentration thereof lower than that of said cathode region, and said lower resistivity region is doped with impurities for producing N-type of conductive type with a concentration higher than that of said higher resistivity region.

10. A diode, comprising:

a first semiconductor region of first conductive type having a lower resistivity, which is formed so that a surface thereof is exposed in a first face side of a semiconductor substrate while occupying a part of a region on said first face;

a second semiconductor region of second conductive type having a lower resistivity, which is arranged so that a surface thereof is exposed in a second face side of said semiconductor substrate;

an electrode arranged on the surface of said first region so as to be connected therewith; and a conductive layer, which is partially interposed between said electrode and said semiconductor substrate, is isolated from said electrode by a dielectric layer, and is connected with said semiconductor substrate in a predetermined location.

11. A diode in accordance with claim 10, further comprising a third semiconductor region having higher resistivity, which is formed between said first semiconductor region and said second semiconductor region.

12. A diode in accordance with claim 11, in which a surface of said third semiconductor region is exposed in a perimeter of said first semiconductor region on said first face, and said conductive layer is arranged so as to be interposed between said surface of said third semiconductor region and said electrode.

13. A diode in accordance with claim 12, in which said first semiconductor region is made up of P-type semiconductor and said second semiconductor region is made up of N-type semiconductor.

14. A diode in accordance with claim 12, in which said third semiconductor region is doped with impurities for producing N-type of conductive type with a concentration thereof lower than that of said second semiconductor region.

15. A diode in accordance with claim 13, in which said third semiconductor region is doped with impurities for producing N-type of conductive type with a concentration thereof lower than that of said second semiconductor region.

16. A diode in accordance with claim 12, in which a fourth semiconductor region of said second conductive type having a lower resistivity is formed in said semiconductor substrate so that a surface of said fourth semiconductor region is exposed on said predetermined location where said semiconductor substrate is to be connected with said conductive layer.

17. A diode in accordance with claim 13, in which a fourth semiconductor region of the second conductive type having a lower resistivity is formed in said semiconductor substrate so that a surface of said fourth semiconductor region is exposed on said predetermined location where said semiconductor substrate is to be connected with said conductive layer.

18. A diode in accordance with claim 15, in which a fourth semiconductor region of he second conductive type having a lower resistivity is formed in said semiconductor substrate so that a surface of said fourth semiconductor region is exposed on said predetermined location where said semiconductor substrate is to be connected with said conductive layer.

* * * * *